REPETITIVE HIGH CURRENT SEMICONDUCTOR SWITCH

Filed Dec. 14, 1960

INVENTORS
ROBERT L. KIDWELL
DONALD E. LITHERLAND
BY Francis H. Beber
ATTORNEY 3,146,356

REPETITIVE HIGH CURRENT SEMICONDUCTOR SWITCH

Robert L. Kidwell, Scottsdale, and Donald E. Litherland, Phoenix, Ariz., assignors to The Garrett Corporation, Los Angeles, Calif., a corporation of California Filed Dec. 14, 1960, Ser. No. 75,726
7 Claims. (Cl. 307—88.5)

This invention relates to keyer circuits for use in keying or switching in a high current power supply to a load such as, for example, the memory core drive of an electronic computer or a power amplifier in a radar or sonar transmitting system. More particularly, the invention contemplates an improved semiconductor keyer circuit for permitting operation at higher speeds than are possible with high current keyer circuits now in use.

It is one of the objects of this invention to provide an improved electronic circuit including silicon controlled rectifiers and associated circuitry for permitting higher speed keyer operation than heretofore possible at high current levels.

Another object is to provide a keyer circuit including silicon controlled rectifiers and a series resonant circuit which are arranged to permit high speed actuation of the keyer operation.

A further object is to provide such a keyer circuit including semiconductors which are arranged to conduct in series and associated with a resonant circuit having a condenser, a current limiting resistor, and an inductor.

Still another object of this invention is to provide an electronic keyer circuit having silicon controlled rectifiers and circuitry including a condenser to be charged in series, a current limiting resistor, and a resonant charging inductor, which are arranged so that the semi-conductors will be turned off in proper sequence.

Another object of this invention is to provide an electronic keyer circuit having series conducting silicon controlled rectifiers, a condenser, a current limiting resistor and a resonant charging inductor, whereby power may be keyed to a load each time a positive pulse is fed to the silicon controlled rectifiers.

A still further object of this invention is to provide an electronic keyer circuit for keying a source of power to a load and having a source of differentiated positive current pulses associated therewith, said circuit comprising a first silicon controlled rectifier which is adapted to connect a source of power to a load when the leading edge of a differentiated positive pulse is fed to the gate thereof, a second silicon controlled rectifier having a condenser, a limiting resistor and an inductor in series therewith for charging the condenser when such positive pulse is fed to the gate thereof, and a third silicon controlled rectifier which is arranged to discharge the condenser when the trailing edge of such pulse is fed to open the gate thereof, whereby such discharge of the condenser will render the silicon controlled rectifiers nonconducting.

The above and other objects of the invention will be apparent from the following description and the accompanying drawing, in which.

Figure 1:
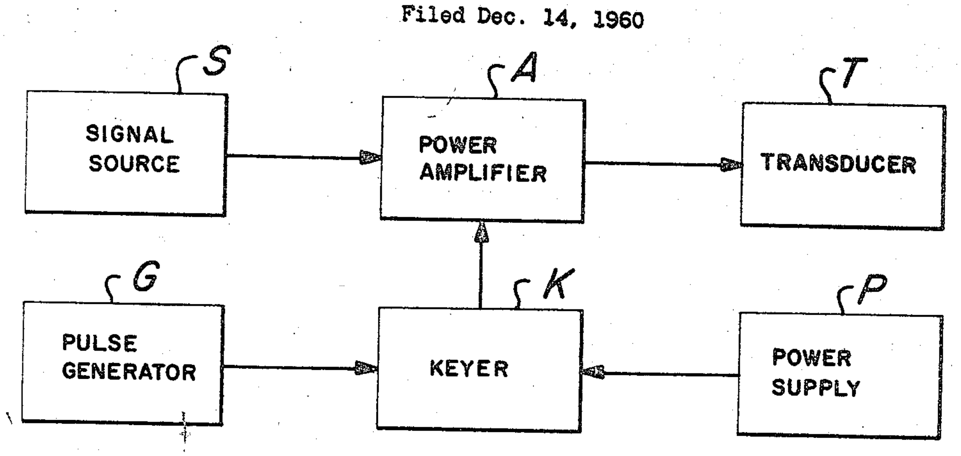
FIG. 1 is a block diagram showing a typical use of a keyer circuit for applying suitable power impulses to an amplifier in a sonar power circuit.

Referring now to the drawing, and particularly to FIG. 1, a keyer, which is designated generally by the reference letter K, is shown included in a radar or sonar power supply circuit. In such an application, which is only one example of many possible uses of the keyer embodying the principles of this invention, a pulse generator G may be provided to furnish the necessary alternating current pulses for operating the semiconductors included in the keyer circuit to be described hereinafter. The power may be fed to the keyer from a power supply P and such power is keyed or switched into an amplifier A at regularly spaced intervals corresponding with the pulse duration as produced by the pulse generator G. Thus far, there has been no limit to the speed or frequency at which the keyer of this invention can operate. The amplifier reecives signals from a signal source S, and after amplification, sends them on to a suitable transducer T, which may be one of several transducers used in the entire circuit.

Figure 2:
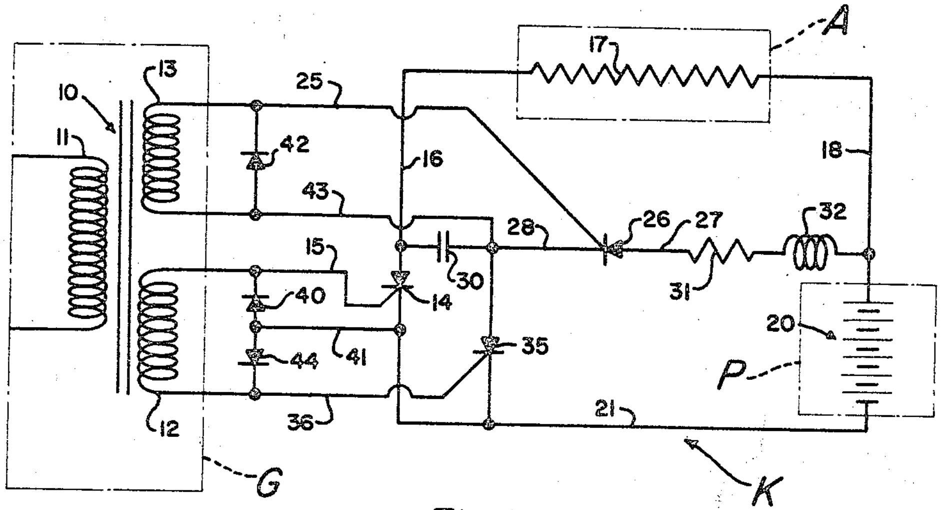
FIG. 2 is a schematic circuit diagram of a keyer circuit embodying the features of this invention.

The FIG. 2 circuit diagram shows the keyer K in circuit with the pulse generator G, which, in this instance, includes a transformer 10 having a primary winding 11 and a plurality of secondary windings 12 and 13. When a low level trigger pulse is applied to the input or primary winding 11, the leading edge of such pulse is differentiated into a positive pulse in the secondary 12. This differentiated pulse is applied to a first semiconductor rectifier 14 through a conductor 15. The semiconductor shown in the present instance is a silicon controlled rectifier of the PNPN type consisting of layers or sandwiches of silicon; and such rectifier has the usual anode, cathode and gate. These silicon controlled rectifiers (hereinafter referred to as SCR's) are now made to function similarly to the well-known gas filled thyratron rectifier tubes except that the forward voltage drop is far less than that encountered with the thyratron. The SCR is constructed to block in a forward direction until triggered by the application of a small signal to the gate lead thereof. Thus, the conductor 15 is connected to the gate lead of the SCR 14 so that the pulse applied thereto causes it to conduct in a forward direction through its anode and a conductor 16 to one side of a load 17, which may be the power amplifier A of FIG. 1. The other side of the load is connected through a lead 18 to the positive side or terminal of a suitable source of direct current (the power supply P of FIG. 1) such as a battery 20 having an output voltage of V. The negative terminal of the battery is connected to the cathode of the SCR 14 through a conductor 21.

Similarly, the leading edge of the pulse applied to the primary 11 produces a differentiated positive pulse in the secondary winding 13 which is applied through a conductor 25 to the gate lead of a second SCR 26. This produces a triggering of SCR 26 which will cause current to flow through a conductor 27, connected from the anode thereof to the positive side of the battery 20, and a line or conductor 28 which completes the circuit by connection with the conductor 16. A capacitor or condenser 30 is included in the line 28 so that closing of the circuit through said line 28 as just described will cause the plates of the capacitor to be charged in accordance with the voltage of the power source 20.

The peak charging current entering capacitor 30 may be limited in the usual way by the provision of a suitable resistance 31 in the line 27. With the voltage of battery 20 set at the predetermined value of V, the charge on the condenser will normally be limited to V. In accordance with this invention, however, an inductance 32 is also included in the conductor 27 in series between the resistance 31 and the positive side of the battery. The arrangement of the inductance 32 and resistance 31 in the line 27 is such that they form a series resonant circuit with the condenser 30; and this resonant circuit rings resonantly thereby charging said condenser 30 to some multiple of the applied voltage such as 1.8V volts. SCR 26 then ceases to conduct by virtue of this overcharge on the condenser 30 so that such overvoltage is maintained as the charge on the plates of the condenser.

In order to discharge the condenser 30 and effectively shut off SCR 14, a third silicon controlled rectifier 35, similar in characteristics to the SCR's 14 and 26, is provided in the keyer circuit. This SCR 35 has its gate lead connected to the secondary winding 12 of the transformer through a line or conductor 36. Hence, the trailing edge of the input pulse will trigger SCR 35 and cause current to flow from the negative side of the battery to the condenser 30. Such current flow will discharge said condenser across SCR 14 and into the load 17. This discharge is so timed as to permit SCR 14 to recover its blocking state and thereby remove all power from the load. At the same time, the reduction in the charge on the condenser 30 reduces the current flow through SCR 35 sufficiently to render it nonconducting.

As described above, a positive pulse is fed to the gates of each of the SCR's 14, 26 and 35 from the pulse source or transformer 10, that for SCR's 14 and 35 being taken from secondary winding 12, and that for SCR 26 coming from winding 13. Provision is made in the circuits for each of the SCR's to eliminate the negative portion of the pulses emanating from the secondary transformer windings 12 and 13. Thus, a suitable diode rectifier 40 has its cathode connected to the conductor 15 and its anode connected by a lead 41 to the conductor 21 leading to the cathode of SCR 14. Similarly, a diode rectifier 42 has its cathode connected to the conductor 25 and a lead 43 completes the circuit between the transformer secondary 13, conductor 28 and the anode of said diode 42. Finally, a diode rectifier 44 is connected between the conductors 36 and 41 so that its cathode is in the circuit to the gate of SCR 35.

Figure 3:
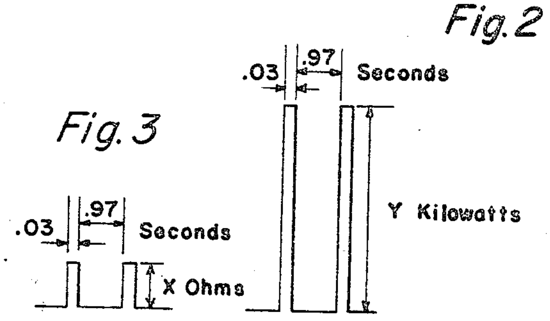
FIG. 3 is a diagrammatic view showing the wave form of the input pulse and then indicating the form of the output pulse produced at the load by the keyer circuit.

In FIG. 3, the wave form of the input pulse is shown and the form of the pulse produced by the keyer is indicated. It will be noted that the time interval between leading and trailing edges of the pulse is the same in both input and output. A typical example of the power that can be handled by the circuit illustrated might involve an input pulse of 0.06 ohm to produce an output of 7 kilowatts delivered to the load.

The use of the series conducting SCR's along with the condenser and the series resonant circuit permits the keyer circuit embodying the principles of this invention to operate at speeds not heretofore attainable at high current levels. As mentioned above, the only limitation on speed thus far encountered has been in the speed of the pulse generator. Any attempts to accomplish the keying in any other manner than that described have not been successful because the circuits could not be arranged to shut off the SCR's properly. For example, it has not thus far been possible to arrange the circuits to shut off the SCR's properly when the SCR's have been tried as a control for the signal source S and the amplifier A consisted of an SCR power inverter. The sequence of steps taking place in the circuit shown in FIG. 2 properly times the turning off of the SCR's so that they are ready to function again to key the power source to the load when the leading edge of the next differentiated positive pulse is fed to the gate of SCR 14. It has been found too that the keyer circuit functions equally well if the resistance 31 and inductance 32 are placed between the SCR 26 and the capacitor 30 instead of in the FIG. 2 positions.

We claim:

1. In combination with means for differentiating positive current pulses, a keyer circuit for connecting a power supply to a load, comprising: first semiconductor means for connecting the power supply to the load when the leading edge of a differentiated positive pulse is fed to said first semiconductor means; a condenser; second semiconductor means for connecting said condenser to the power supply when said leading edge of the differentiated positive pulse is fed to said second semiconductor means; and a third semiconductor means for discharging said condenser when the trailing edge of said differentiated positive pulse is fed to said third semiconductor means, thereby returning said first semiconductor to a blocking state and removing the power from the load.

2. A keyer circuit for use with a source of differentiated positive current pulses for rapidly connecting a power supply to a load, comprising: first semiconductor means for connecting the power to the load when the leading edge of a differentiated positive pulse is fed to said first semiconductor means; a condenser; second semiconductor means for connecting said condenser to the power supply when said leading edge of the differenated positive pulse is fed to said second semiconductor means; and a third semiconductor means for discharging said condenser when the trailing edge of said differentiated positive pulse is fed to said third semiconductor means, thereby returning said first semiconductor to a blocking state and removing the power from the load.

3. In combination with means for differentiating positive current pulses, a keyer circuit for connecting a power supply to a load, comprising: first semiconductor means for connecting the power to the load when the leading edge of a differentiated positive pulse is fed to said first semiconductor means; a condenser; second semiconductor means, having a resonant circuit in series therewith, for connecting said condenser to the power supply to charge said condenser when said leading edge of the differentiated positive pulse is fed to said second semiconductor means; and a third semiconductor means for discharging said condenser when the trailing edge of said differentiated positive pulse is fed to said third semiconductor means, thereby returning said first semiconductor to a blocking state and removing the power from the load.

4. In combination with means for differentiating positive current pulses, a keyer circuit for connecting a power supply to a load, comprising: first semiconductor means for connecting the power to the load when the leading edge of a differentiated positive pulse is fed to said first semiconductor means; a condenser; second semiconductor having a limiting resistor and a resonant circuit in series with said second semiconductor and said condenser for connecting said condenser to the power supply when said edge of the differentiated positive pulse is fed to said second semiconductor means; and a third semiconductor means for discharging said condenser when the trailing edge of said differentiated positive pulse is fed to said third semiconductor means, thereby returning said first semiconductor to a blocking state and removing the power from the load.

5. A keyer circuit for use with a source of differentiated positive current pulses for rapidly connecting a power supply to a load, comprising: a first silicon controlled rectifier for connecting the power to the load when said rectifier is rendered conducting by the application of the leading edge of a differentiated positive current pulse to the gate of said first silicon controlled rectifier; a condenser shunted across the load; a second silicon controlled rectifier in series with said condenser and adapted to connect the power supply to the condenser when said current pulse is fed to the gate of said second rectifier; and a third silicon controlled rectifier having circuit means associated therewith so that said rectifier is rendered conducting upon application of the trailing edge of said differentiated pulse to the gate of said third silicon controlled rectifier, thereby discharging said condenser and rendering the first silicon controlled rectifier nonconducting.

6. A keyer circuit for use with a source of differentiated positive current pulses for rapidily connecting a power supply to a load, comprising: a first silicon controlled rectifier for connecting the power to the load when said rectifier is rendered conducting by the application of the leading edge of a differentiated positive current pulse to the gate of said first silicon controlled rectifier; a condenser shunted across the load; a second silicon controlled rectifier in series with said condenser and adapted to connect the power supply to the condenser when said current pulse is fed to the gate of said second rectifier, said second rectifier having a limiting resistor and an inductor in series therewith; and a third silicon controlled rectifier having circuit means associated therewith so that said rectifier is rendered conducting upon application of the trailing edge of said differentiated pulse to the gate of said third silicon controlled rectifier, thereby discharging said condenser and rendering the first silicon controlled rectifier nonconducting.

7. In combination with means for differentiating positive current pulses, a repetitive high current semiconductor switch for rapidly connecting a power supply to a load, comprising: a first silicon controlled rectifier for connecting the power to the load when said rectifier is rendered conducting by the application of the leading edge of a differentiated positive current pulse to the gate of said first silicon controlled rectifier; a series circuit shunted across the load and including a condenser, a second silicon controlled rectifier, a limiting resistor and an inductor, said second silicon controlled rectifier being arranged in said series circuit to connect the power supply to the condenser, through said resistor and inductor, when said differentiated current pulse is fed to the gate of said second silicon controlled rectifier; and a third silicon controlled rectifier having circuit means associated therewith so that said rectifier is rendered conducting upon application of the trailing edge of said differentiated pulse to the gate of said third silicon controlled rectifier, thereby discharging said condenser and rendering the first silicon controlled rectifier nonconducting.

References Cited in the file of this patent

UNITED STATES PATENTS 2,964,711 Steinke ---------------- Dec. 13, 1960

OTHER REFERENCES

ECG-271-1, "Notes on the Application of the Silicon Controlled Rectifier," General Electric, December 1958 (pages 36 to 38 relied on).

---

UNITED STATES PATENT OFFICE
CERTIFICATE OF CORRECTION

Patent No. 3,146,356 August 25, 1964

Robert L. Kidwell et al.

It is hereby certified that error appears in the above numbered patent requiring correction and that the said Letters Patent should read as corrected below.

Column 4, line 12, for "differenated" read -- differentiated --; line 41, before "having" insert -- means --; line 44, before "edge" insert -- leading --; same column 4, line 70, for rapidily" read -- rapidly --.

Signed and sealed this 15th day of December 1964.

(SEAL)
Attest:

ERNEST W. SWIDER
Attesting Officer

EDWARD J. BRENNER
Commissioner of Patents